(12) United States Patent
Kirkpatrick et al.

(10) Patent No.: US 11,205,578 B2
(45) Date of Patent: Dec. 21, 2021

(54) DOPANT ANNEAL WITH STABILIZATION STEP FOR IC WITH MATCHED DEVICES

(71) Applicant: Texas Instruments Incorporated, Dallas, TX (US)

(72) Inventors: Brian K. Kirkpatrick, Allen, TX (US); Kenneth Palomino, San Francisco, CA (US); Mahalingam Nandakumar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/161,920

(22) Filed: Oct. 16, 2018

(65) Prior Publication Data

US 2019/0115226 A1    Apr. 18, 2019

Related U.S. Application Data (60) Provisional application No. 62/574,022, filed on Oct. 18, 2017.

(51) Int. Cl.
| | | |
|---|---|---|
| *H01L 21/324* | (2006.01) | |
| *H01L 49/02* | (2006.01) | |
| *H01L 27/07* | (2006.01) | |
| *H01L 21/225* | (2006.01) | |
| *H01L 21/268* | (2006.01) | |
| *H01L 27/06* | (2006.01) | |
| *H01L 21/265* | (2006.01) | |

(52) U.S. Cl.
CPC ........ *H01L 21/324* (2013.01); *H01L 21/2253* (2013.01); *H01L 21/268* (2013.01); *H01L 21/26513* (2013.01); *H01L 27/0629* (2013.01); *H01L 27/0738* (2013.01); *H01L 28/20* (2013.01)

(58) Field of Classification Search
CPC .............. H01L 21/324; H01L 21/2253; H01L 27/0738; H01L 28/20; H01L 21/268; H01L 27/0629; H01L 21/26513
USPC ....................................................... 438/238
See application file for complete search history.

(56) References Cited

U.S. PATENT DOCUMENTS

| | | | |
|---|---|---|---|
| 6,393,210 B1 | 5/2002 | Wu | |
| 6,406,956 B1 * | 6/2002 | Tsai | .................... H01L 27/0629 257/E21.004 |
| 9,190,277 B2 | 11/2015 | Nandakumar | |

(Continued)

*Primary Examiner* — Vu A Vu (74) *Attorney, Agent, or Firm* — Andrew R. Ralston; Charles A. Brill; Frank D. Cimino (57) ABSTRACT

A method of fabricating an integrated circuit (IC) includes providing a substrate having a semiconductor surface layer thereon including a field dielectric in a portion of the semiconductor surface layer and a pair of matched devices in at least one of a CMOS area, BiCMOS area, bipolar transistor area, and a resistor area. Dopants are ion implanted into the at least one of the CMOS area, the BiCMOS area, the bipolar transistor area, and the resistor area. The substrate is annealed in a processing chamber of a rapid thermal processor (RTP). The annealing comprises an initial temperature stabilization step including first annealing at a lower temperature for a first time of at least 20 seconds, and then a second annealing comprising ramping from the lower temperature to a peak higher temperature that is at least 100° C. higher (>) than the lower temperature.

28 Claims, 7 Drawing Sheets

(56) References Cited

U.S. PATENT DOCUMENTS

| | | | | |
|---|---|---|---|---|
| 2001/0026972 | A1* | 10/2001 | Wakabayashi | H01L 27/0629 438/238 |
| 2006/0008964 | A1* | 1/2006 | Mineji | H01L 21/823814 438/199 |
| 2006/0166457 | A1* | 7/2006 | Liu | H01L 27/0629 438/400 |
| 2007/0298575 | A1* | 12/2007 | Nouri | H01L 29/6659 438/308 |
| 2008/0286921 | A1* | 11/2008 | Yu | H01L 21/28052 438/238 |
| 2009/0047768 | A1* | 2/2009 | Jain | H01L 21/2251 438/306 |
| 2009/0242944 | A1* | 10/2009 | Zhang | H01L 21/324 257/288 |
| 2010/0025744 | A1* | 2/2010 | Miyashita | H01L 21/26506 257/288 |
| 2012/0098071 | A1* | 4/2012 | Aggarwal | H01L 27/0629 257/369 |
| 2012/0244725 | A1* | 9/2012 | Fuse | H01L 21/26513 438/799 |
| 2013/0149849 | A1* | 6/2013 | Nandakumar | H01L 21/26513 438/532 |
| 2014/0377942 | A1* | 12/2014 | Noguchi | H01L 29/7397 438/529 |
| 2015/0104914 | A1* | 4/2015 | Yang | H01L 21/76224 438/238 |
| 2015/0372144 | A1* | 12/2015 | Fang | H01L 21/823821 257/192 |
| 2016/0141181 | A1* | 5/2016 | Cho | H01L 21/28537 438/229 |
| 2017/0117152 | A1* | 4/2017 | Aoyama | H01L 21/2253 |
| 2017/0125312 | A1* | 5/2017 | Ono | H01L 21/67248 |
| 2017/0186850 | A1* | 6/2017 | Morimoto | H01L 21/0206 |
| 2017/0317165 | A1* | 11/2017 | Brandt | H01L 21/324 |
| 2018/0182625 | A1* | 6/2018 | Nishiwaki | H01L 21/324 |
| 2018/0190493 | A1* | 7/2018 | Kumar | H01L 21/26513 |
| 2019/0131440 | A1* | 5/2019 | Lee | H01L 21/263 |

\* cited by examiner

FIG. 5

DOPANT ANNEAL WITH STABILIZATION STEP FOR IC WITH MATCHED DEVICES

CROSS REFERENCE TO RELATED APPLICATIONS

This application claims the benefit of Provisional Application Ser. No. 62/574,022 entitled "Low Temp Stabilization in High Temperature Spike/Laser Anneal Processes to Improve Sheet Resistance Uniformity", filed Oct. 18, 2017, which is herein incorporated by reference in its entirety.

FIELD

This Disclosure relates to processing of semiconductor substrates (e.g., wafers), more particularly to rapid thermal anneal processing for semiconductor substrates comprising integrated circuits (IC) die having matched devices.

BACKGROUND

Rapid thermal annealing (RTA) is commonly used in various stages of semiconductor manufacturing. For example, RTA has been used for the annealing of dopant implanted semiconductor wafers. Because the operating temperature in RTA can be rapidly increased or decreased, as compared to conventional furnace annealing the needed processing time is short and the process efficiency is high.

A known rapid thermal processor (RTP) for RTA of a semiconductor wafer comprises a processing chamber where the semiconductor wafer can be treated that includes a rotatable susceptor mounted within the processing chamber. A wafer to be processed is held and supported by susceptor, which can be rotated along with the susceptor. A gas delivery system flows a gas composition into the processing chamber that generally operates at a single peak temperature of from about 500° C. to about 1200° C. The heat source can comprise a plurality of heating units each having a lamp, for example a halogen lamp, or can comprise a laser that is scanned or rastered across the surface of the wafer.

RTA can be used for high ramp rate high temperature semiconductor fabrication annealing processes (e.g., a refined spike anneal or laser anneal), such as for advanced complementary metal oxide semiconductor (CMOS) processes to improve the dopant activation percentage and reduce junction diffusion as compared to conventional furnace anneals. However, the high temperature ramp rate can cause non-uniform heating across the wafer and across the area of each die on the wafer resulting in a significant variation in the sheet resistance of ion implanted or diffused dopant regions in a silicon surface or in a polysilicon layer above the silicon surface.

ICs may include matched devices that are closely spaced on the substrate to improve their matching, such as being <1 μm apart (e.g., 0.2 μm apart) and being positioned side-by-side. The matched devices can comprise input transistors of an operational amplifier (op amp), for example, that are accurately matched to provide the op amp a low input offset voltage. Resistors may also be embodied as matched resistors. The matched devices need not be accurate to an absolute value, only that their parametric ratios are matched, such as being in a ratio of 1:1 in a typical case.

For example, matched resistors with high variability between them that do not meet their designed resistance ratio can require trimming at wafer probe for precision analog IC applications. Some example precision analog IC applications that have matched devices include precision op amps, precision analog-to-digital converters (ADCs), and precision voltage control oscillators (VCOs). Hence variability between the performance of the respective matched devices can lead to increased wafer probe time and higher wafer probe cost.

Several methods are known for controlling the dopant diffusion variation for improving device matching for matched devices. There are layout methods that are generally only marginally effective. There are also ion implantation methods for improving device matching of paired devices that may be somewhat more effective, such as a cryogenic ion implantation, a pre-amorphization ion implant, or carbon or indium implantation. A new method to control the dopant diffusion variation that does not add any process steps which provides a reduced across the die variation in sheet resistance (Rs), so as for MOS transistors to better control variation in the threshold voltage (Vt), gate to drain capacitance (Cgd), and/or effective channel length (Leff), or to better control variation in the gain for bipolar junction transistor (BJT) devices, is therefore desirable.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include a method of fabricating an IC comprising providing a substrate (e.g., a wafer) having a semiconductor surface layer thereon including a field dielectric in a portion of the semiconductor surface layer and a pair of matched devices in at least one of a CMOS area, BiCMOS area, bipolar transistor area, and a resistor area. Dopants are ion implanted into the CMOS area, the BiCMOS area, the bipolar transistor area, and/or the resistor area. The substrate is annealed in a processing chamber of a RTP. The annealing comprises an initial temperature stabilization step including first annealing at a lower temperature for a first time of at least 20 seconds, and then a second annealing comprising ramping from the lower temperature to a peak higher temperature that is at least 100° C. higher (>) than the lower temperature.

BRIEF DESCRIPTION OF THE DRAWINGS

Reference will now be made to the accompanying drawings, which are not necessarily drawn to scale, wherein.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed RTA heat cycling solves the above-described need to control the dopant diffusion variation across the wafer and the IC die on the wafer without adding any costly processing such as extra ion implants, particularly for those ICs having matched devices, which provides a reduced variation in electrical parameters across the IC die. This problem is solved by adding a temperature stabilization step at a first temperature being a lower temperature that is below a temperature that is sufficient to create Transient Enhanced Diffusion (TED) or Solid Phase Epitaxy (SPE), but the lower temperature is high enough so that the difference between this lower temperature and the higher temperature used in the subsequent second annealing is such that the dopant diffusion at the lower temperature is negligible as compared to the dopant diffusion at the second higher temperature. The stabilization step is generally selected for its duration relative to the temperature uniformity achieved across all temperature zones within the chamber of the RTP tool during the higher temperature subsequent annealing. Known RTA temperature stabilization steps, such as shown in FIG. 1 described below as RTA 100, are recognized herein to be insufficient in both temperature selection and duration to achieve good matched device parametric matching results.

RTA is conventionally divided into three different heat cycle categories, a soak RTA, a standard spike RTA, and a refined spike RTA. A soak RTA process is characterized by a temperature profile that climbs rapidly from room temperature, possibly including multiple different ramp rates, reaching a "soak" higher temperature that is held for some period of time, typically greater than 10 seconds, such as at least 15 seconds. A standard spike RTA process is characterized by a temperature profile that climbs rapidly from room temperature, possibly including multiple ramp rates, with the temperature profile moving from 3° to 10° C. below the maximum temperature, then to the maximum temperature (typically for 100 to 300 milliseconds), and then back to 3 to 10° C. below the maximum temperature, all typically in 3 to 5 seconds. This results in a temperature profile that resembles a parabolic arc around the maximum temperature.

A refined spike RTA process has less time at the high temperature as compared to the standard spike RTA process, typically a 2× to 3× reduction in this time, and is characterized by a temperature profile that climbs rapidly from room temperature, possibly including multiple ramp rates, reaching a maximum temperature that is only achieved for a very short period (i.e., essentially an instant), such as <100 milliseconds. In the case of refined spike RTA process, the temperature profile moves from 3° to 10° C. below the maximum temperature, then to the maximum temperature, and then back to 3° to 10° C. below the maximum temperature, all in less than 1 to 2 seconds, which visually causes the temperature profile to resemble the pointy tip of a triangle.

Figure 1:
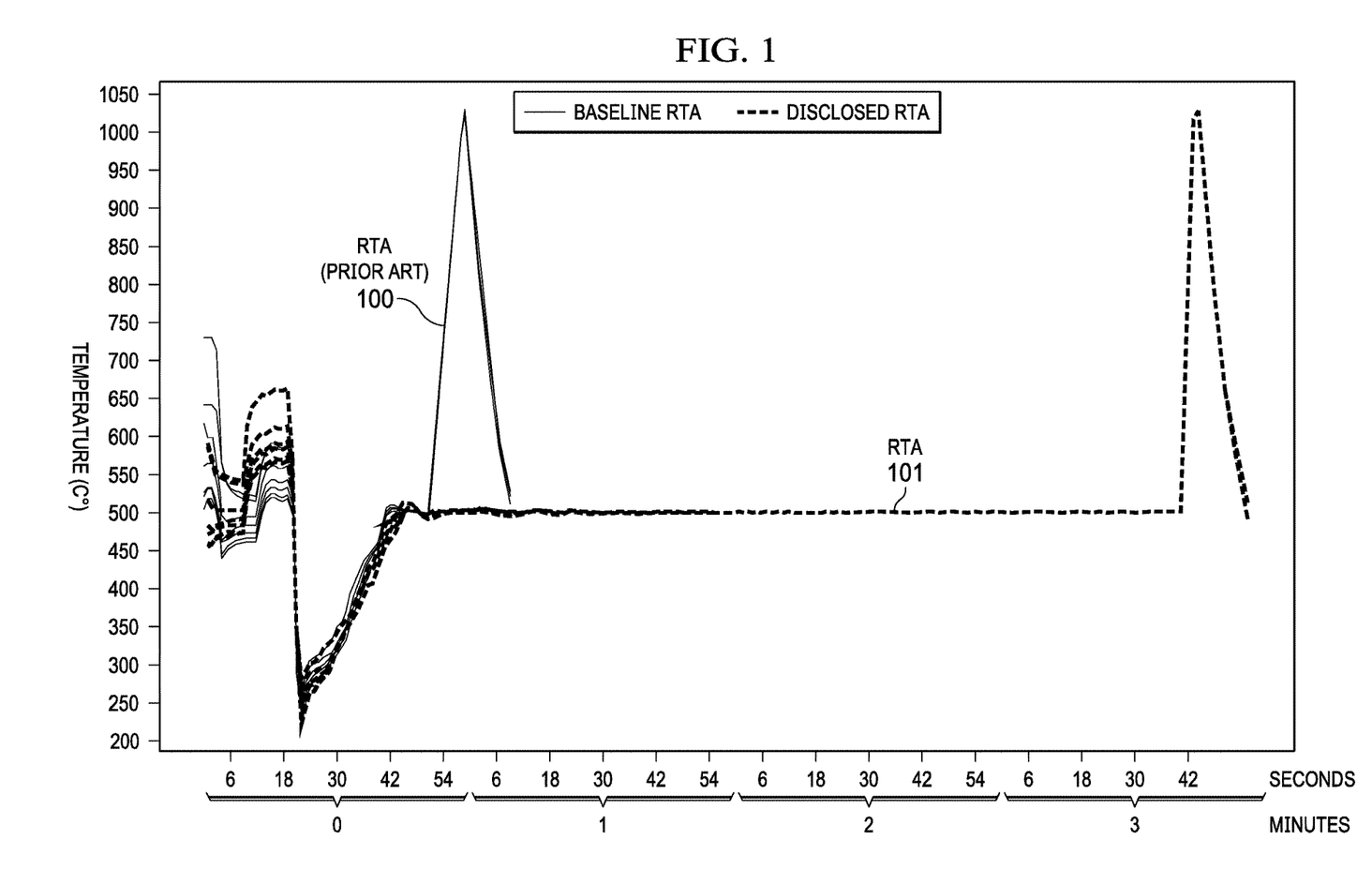
FIG. 1 shows a temperature vs. time plot for an example RTA heat cycle that includes an initial temperature stabilization step including first annealing at a lower temperature for a first time of at least 20 seconds and then a second annealing comprising ramping from the lower temperature to a peak higher temperature that is at least 100° C.>than the lower temperature.

FIG. 1 shows a temperature vs. time plot for an example RTA heat cycle shown as RTA 101 identified as a 'disclosed RTA' being a refined spike RTA that includes an initial temperature stabilization step including first annealing at a lower temperature shown as 500° C. for about 180 seconds, and then a second annealing comprising a refined spike RTA that ramps from the lower temperature to a peak higher temperature shown as 1,025° C. The known RTA heat cycle shown as RTA 100 identified as a 'baseline RTA' is also shown as a refined spike RTA that has a temperature stabilization time at the lower temperature of about 8 seconds, that is shown again using a peak high temperature of about 1025° C.

Disclosed RTA heat cycles have unexpectedly been found to improve the matching of closely spaced matched devices confirmed with both boron doped matched polysilicon resistors and matched MOS transistors. As used herein, matched devices are located on the IC die within 1 µm of one another, and both devices are within an IC device that relies on their matching, such as the IC 300 shown in FIG. 3 described below that has both matched transistors and matched resistors. This unexpected result is the significant improvement in matching electrical parameters between the matched devices that are only minimum spaced 1 µm or less apart from one another, such as <0.1 µm, for example 0.02 µm to <0.1 µm apart, believed to be due to the significant improvement in temperature uniformity across the die area provided by the temperature stabilization step in disclosed RTA heat cycles.

The IC generally comprises an analog IC, and can include a CMOS area and a resistor area including matched polysilicon resistors. The matched polysilicon resistors can comprise zero temperature coefficient resistors (ZTCRs). As used herein, a ZTCR displays very little change in its resistance over a change in semiconductor device operating temperature, being of no more than 200 parts per million (ppm)/° C., such as 20 to 200 ppm/° C. over a range in temperature between −55° C. and 200° C.

The lower temperature can be 450° C. to 650° C., the first time can be 20 seconds to 210 seconds, such as 30 to 90 seconds, and the peak higher temperature can be 850° C. to 1250° C. The annealing can comprise soak rapid thermal annealing, standard spike rapid thermal annealing, or refined spike rapid thermal annealing. The time at the peak higher temperature can be for less than 0.1 seconds. For a refined spike rapid thermal anneal, the peak higher temperature can be at least 1000° C. and the time at the peak higher temperature can be for less than (<) 5 seconds, such as <1 second, for example 5 to 40 milliseconds. The annealing can comprise laser annealing and the peak higher temperature can be >1,000° C.

The dopant can comprise variety of dopants including boron and indium as p-type dopants, and phosphorus, arsenic or antimony as n-type dopants. Boron due its high relative diffusion coefficient in silicon relative to other dopants is known to be the most difficult of the dopants to match dopant profiles. The dose of boron can be as low as $5 \times 10^{11}$ cm$^{-2}$ for a pocket implant, as low as $5 \times 10^{12}$ cm$^{-2}$ for a lightly doped drain (LDD) implant, and generally has a dose at least $5 \times 10^{14}$ cm$^{-2}$ for implanting sources and drains, emitters, and ZTCRs.

FIGS. 2A-D show enhanced cross-sectional views of an in-process IC, depicted in successive stages of fabrication using a method for forming an IC having at least one of matched MOS transistors, matched bipolar transistors, and matched polysilicon resistors, that includes a disclosed RTA heat cycle including an initial temperature stabilization step including first annealing at a lower temperature, then a second annealing comprising ramping from the lower temperature to a peak higher temperature that is at least 100° C.>than the lower temperature. The enhancement in these FIGS. in the in-process IC views provided is to show the neighboring devices in each of the matched device pairs.

Figure 2A:
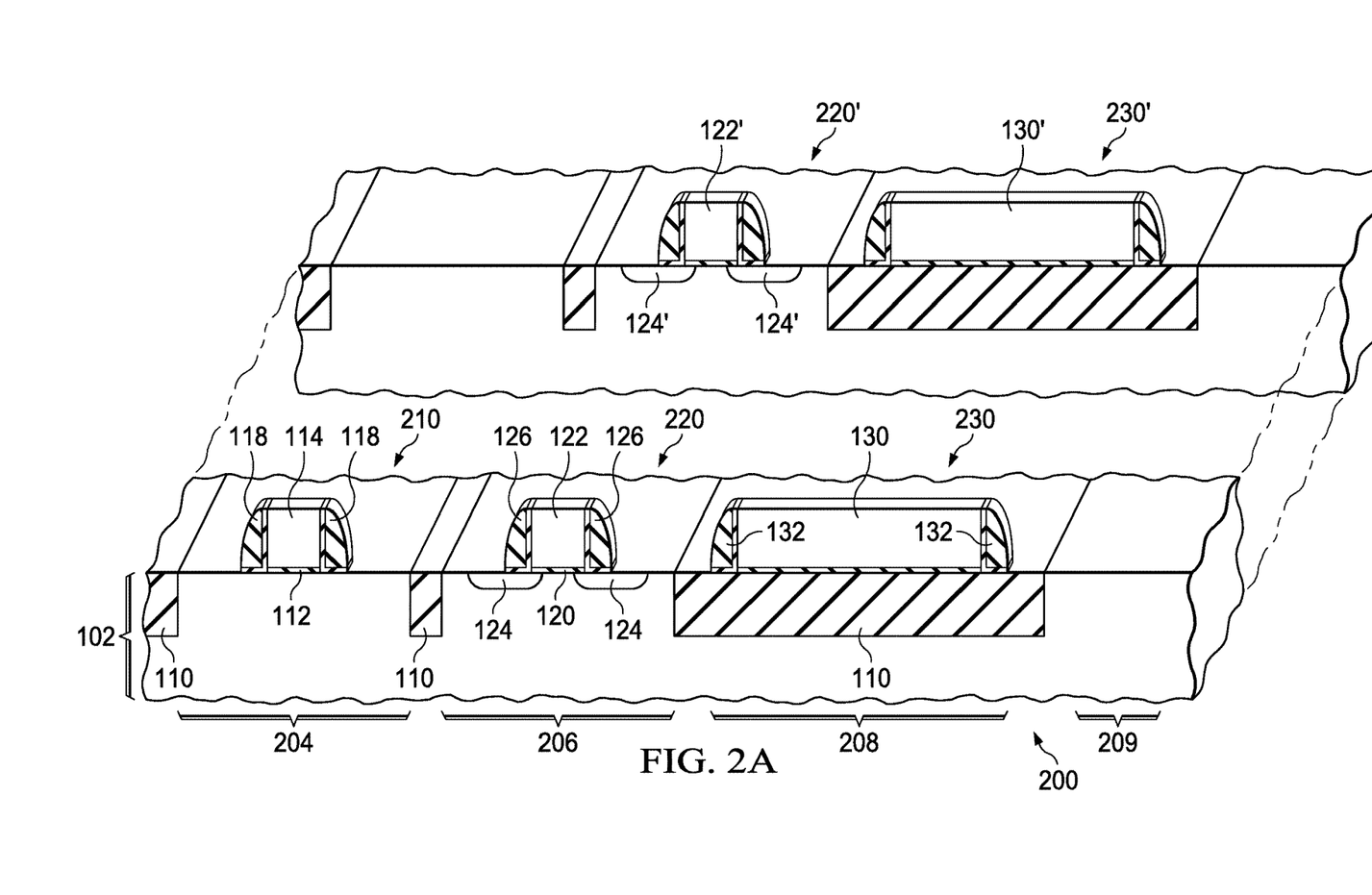
FIGS. 2A-D show enhanced cross-sectional views of an in-process IC, depicted in successive stages of fabrication that includes using a method for forming an IC having at least one of matched MOS transistors, matched bipolar transistors, and matched polysilicon resistors that utilizes a disclosed RTA heat cycle including an initial temperature stabilization step including first annealing at a lower temperature then a second annealing comprising ramping from the lower temperature to a peak higher temperature that is at least 100° C.>than the lower temperature.

Referring to FIG. 2A, the IC 200 shown is formed on a semiconductor substrate 102, for example a silicon wafer, silicon-on-insulator (SOI) wafer, hybrid orientation technology (HOT) wafer, or other substrate suitable for fabrication of the IC 200. A diameter of the substrate can be at least 150 mms, at least 200 mms, or at least 300 mms. The IC 200 includes an n-channel metal oxide semiconductor (NMOS) area 204 for NMOS transistors shown as NMOS transistor 210, a PMOS area 206 for PMOS transistors shown including PMOS transistors 220 and 220' that are matched, a ZTCR area 208 for ZTCRs shown including polysilicon ZTCRs 230 and 230' that are matched, and a bipolar transistor area 209 described for pnp bipolar transistors later shown as 240 and 240' that are matched. The NMOS area 204 together with PMOS area 206 provides a CMOS area, while the CMOS area along with the bipolar transistor area provides a BiCMOS area. The field oxide 110, for example formed by a shallow trench isolation (STI) process, may provide laterally electrical isolation on the IC 200 which may underlie the ZTCR area 208.

The NMOS transistor 210 includes a gate dielectric layer 112, a polysilicon gate 114 over the gate dielectric layer 112, and gate sidewall spacers 118. The matching PMOS transistors 220 and 220' include a gate dielectric layer 120, a polysilicon gate 122 and 122' respectively over the gate dielectric layer 120, and p-channel LDD (PLDD) regions 124 and 124' respectively, and gate sidewall spacers 126. In one version of the instant example, the polysilicon gate 114 of the NMOS area 204 and the polysilicon gates 122, 122' of the PMOS area 206 may each have a physical gate length less than 60 nanometers. The ZTCR area 208 includes matching polysilicon ZTCRs 230 and 230' comprising a polysilicon resistor body 130 and 130', respectively, and sidewall spacers 132.

Figure 2B:
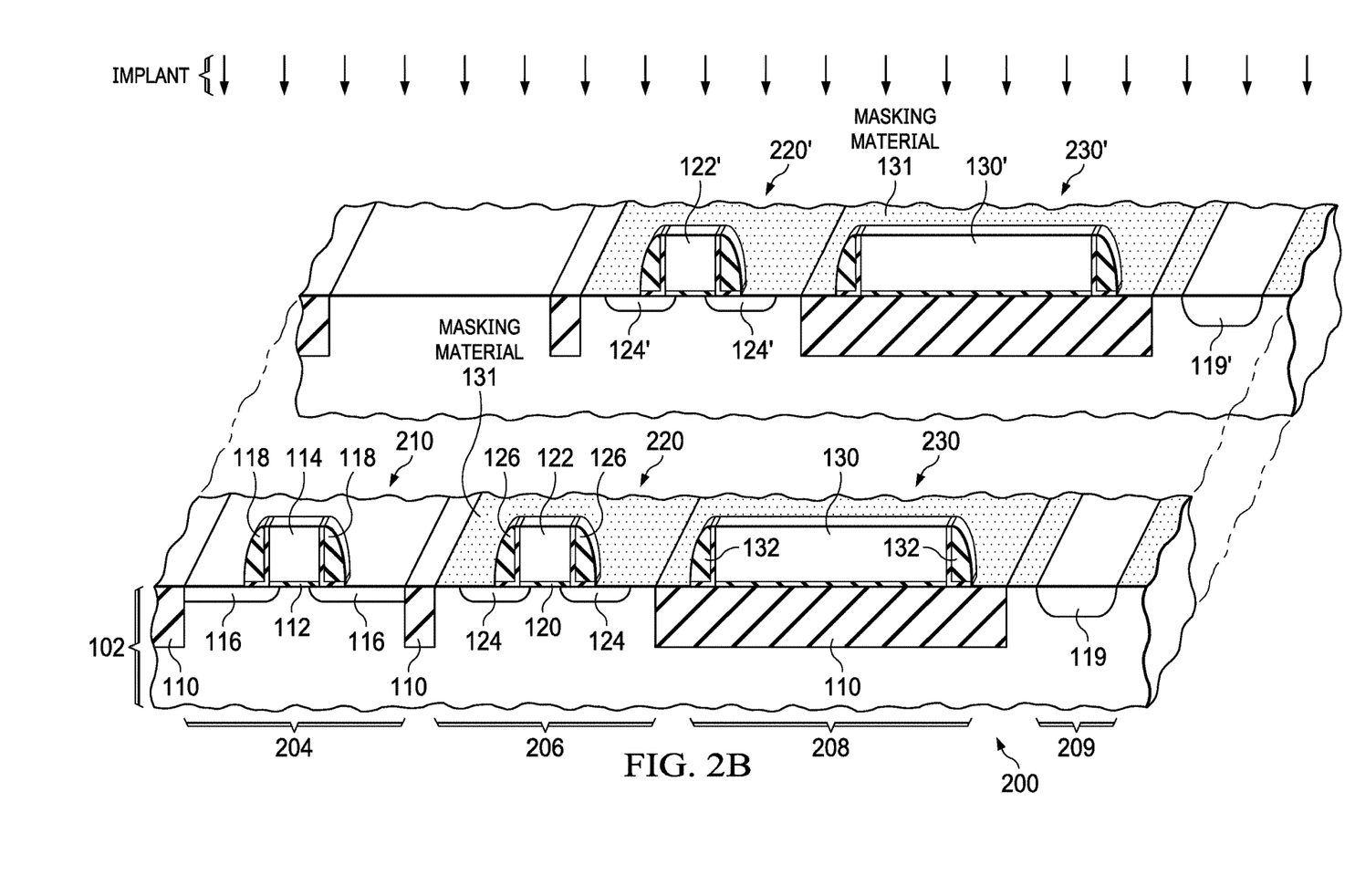

FIG. 2B shows an n-channel LDD (nLDD) and n-base implant being performed using an nLDD and n-base implant masking material 131 that is patterned over the top surface of the IC 200 so as to only expose the NMOS area 204 and the bipolar transistor area 209. The implant masking material 131 may include photoresist formed using a photolithographic process. For example, the dose of the nLDD and n-base implant may be $1 \times 10^{12}$ cm$^{-2}$ to $5 \times 10^{13}$ cm$^2$ using n-type dopants such as phosphorus and/or arsenic to form the nLDD regions 116 for the NMOS transistor 210 and nbase regions 119, 119' in bipolar transistor area 209 as shown. The nbase regions 119, 119' though described as being part of a bipolar transistor, as they are into p-type material, can instead be used as a matched diffused resistor.

Figure 2C:
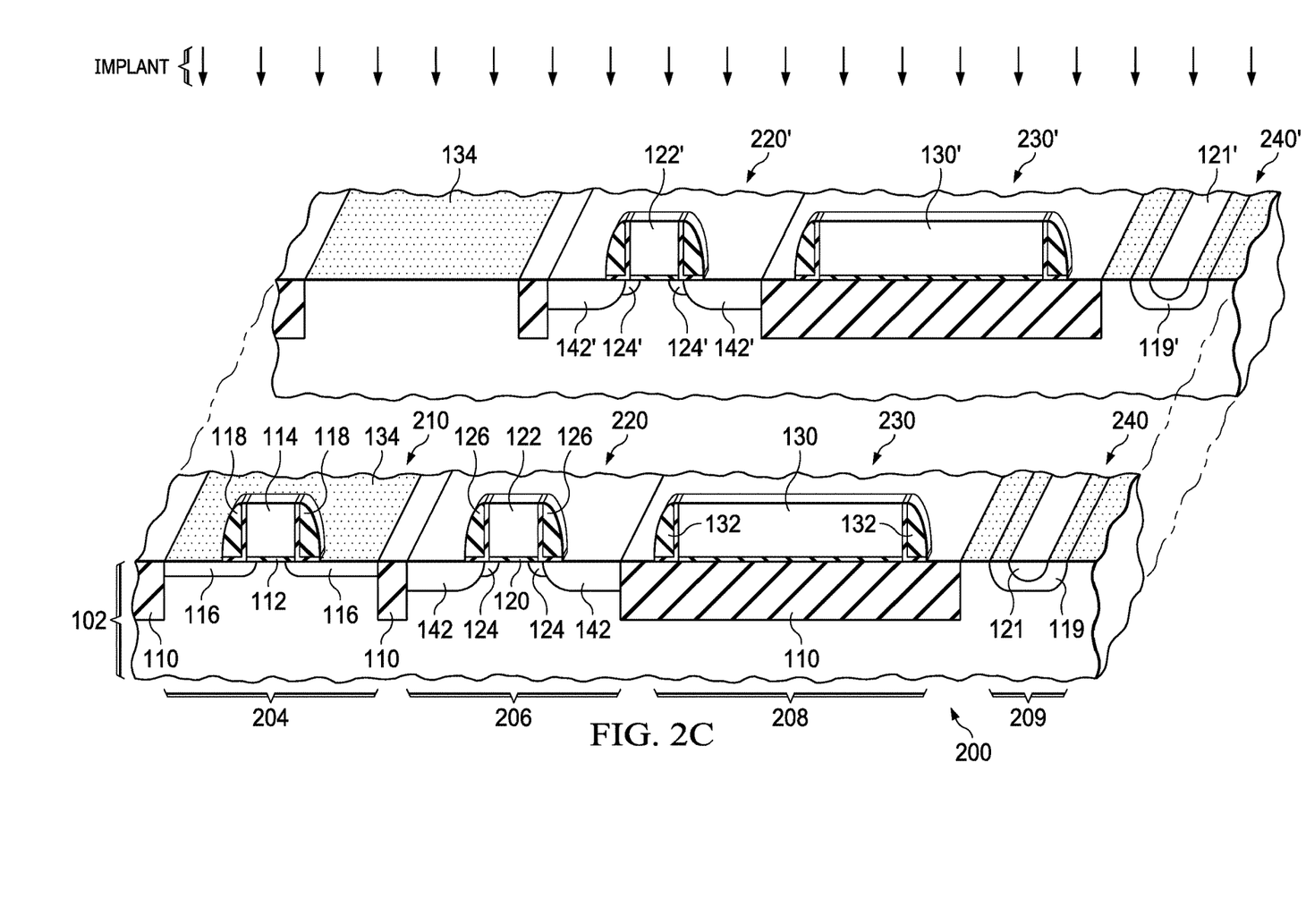

FIG. 2C shows an ion implant being performed using a masking material 134 that is patterned over the top surface of the substrate 102 providing P sources and a P drains (PSDs), p-emitters, and ZTCRs. In some instances, the ZTCRs can have a dedicated implant to provide a different dopant concentration as compared to the other highly doped regions. The masking material 134 only exposes the PMOS area 206, a center portion of the nbase regions 119, 119' over the bipolar transistor area 209, and the polysilicon ZTCRs 230 and 230'. In one version of the instant example, the dose of this implant may be at least $1 \times 10^{15}$ cm$^{-2}$. In a further version, the dose may be at least $5 \times 10^{15}$ cm$^{-2}$. Boron is generally used as the p-type implant into the substrate 102 in the PMOS area 206 adjacent to the gate sidewall spacers 126 to form first PSD implanted regions 142, 142' in the substrate 102, implant the polysilicon gates 122, 122', implant the polysilicon resistor bodies 130 and 130', as well as to form the p-emitters 121 and 121'.

Figure 2D:
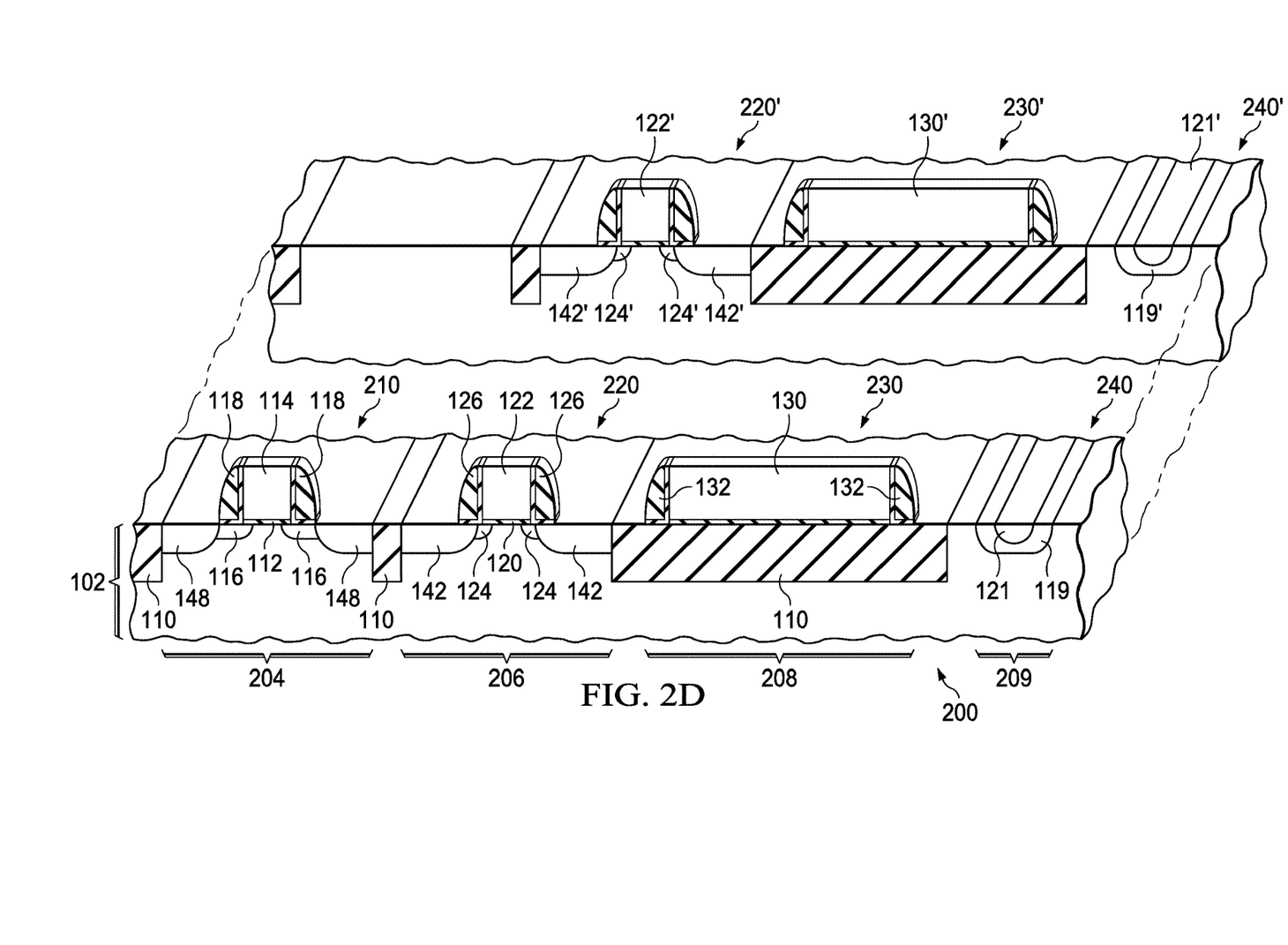

FIG. 2D shows results after an NSD ion implant that implants an n-type dopant to form NSDs 148 for the NMOS transistor 210, followed by a disclosed RTA step. In the NSD ion implant N+ contacts may also be provided on the IC, such as for n+ contacts for the n-bases 119, 119'. A dose for the NSD implant may be selected to provide desired control of an effective channel length of the NMOS transistors 210. For example, the dose of the NSD implant may be $1 \times 10^{15}$ cm$^{-2}$ to $6 \times 10^{15}$ cm$^{-2}$.

The disclosed RTA step that anneals dopants in regions including in the PSDs 142, 142', NSD 148, p-emitters 121, 121', and polysilicon ZTCRs 230, 230', which activates and slightly diffuses the dopants in these regions. As described previously, the disclosed RTA step includes an initial temperature stabilization step including first annealing at a lower temperature for a first time of at least 20 seconds (e.g., 30-90 sec), and then a second annealing comprising ramping from the lower temperature to a peak higher temperature that is at least 100° C. higher (>) than the lower temperature. For example, the RTA 101 shown in FIG. 1 may be used. The IC 200 may then be completed using conventional IC processing, including formation of a pre-metal dielectric (PMD) layer, then forming filled contacts (e.g., tungsten filled) through the PMD to the semiconductor surface of the substrate 102, and then generally forming 2 or more levels of metallization with interlevel dielectric (ILD) between the metal layers, followed by a passivation layer(s).

Figure 3:
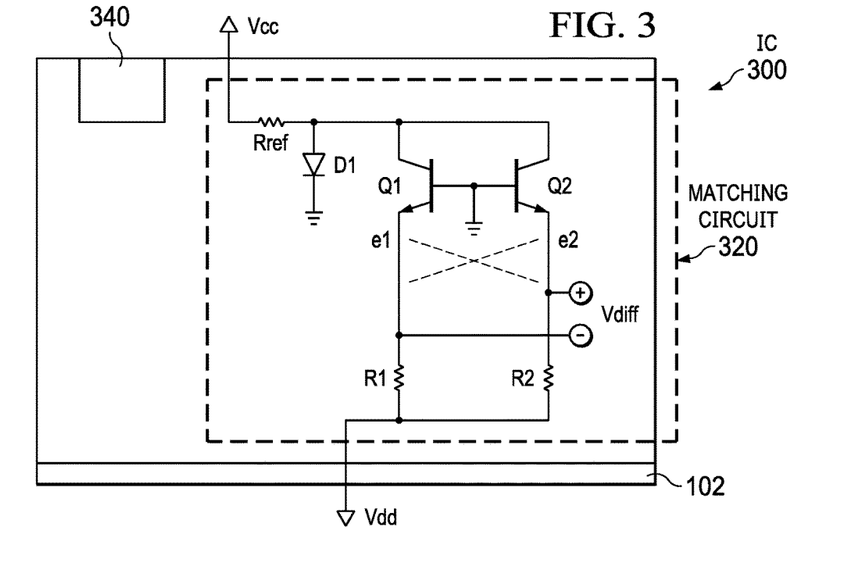
FIG. 3 shows an example IC including an example bipolar transistor-based matching circuit including matched transistors and matched resistors that can benefit from a disclosed RTA heat cycle.

FIG. 3 shows a portion of an IC 300 that includes an example NPN bipolar-based matching circuit 320 formed on a substrate 102 that relies on base-emitter voltage Vbe matching, such as for differential signal processing applications, that can benefit from disclosed aspects by improved control over the emitter diffusion across the die including between neighboring matched transistors and between matched resistors. The IC 300 also includes functional circuitry shown as block 340 that although not shown coupled is coupled to utilize the Vdiff signal generated by the matching circuit 320. Q1 and Q2 shown are the two matched transistors that are being compared by the matching circuit 320.

Rref and D1 set the voltage of the two collectors of Q1 and Q2 to about 0.6 V. This is done to keep the transistors Q1 and Q2 out of saturation. The two bases of Q1 and Q2 are connected together and to a circuit ground. Currents are drawn from the two emitters of Q1 and Q2 to the negative supply Vdd via matched resistors shown as R1 and R2. The emitter voltages, e1 and e2 provide the Vdiff output which is a measure of their voltage difference.

In an ideal circuit, Q1 and Q2 are perfectly matched (e.g., the same current gain) and the resistors R1 and R2 have exactly equal resistance values. In that case the matching circuit 320 is perfectly symmetrical electrically so that Vdiff is 0V. However, in the real-world the transistors Q1 and Q2 are mismatched to some extent, but for this example assume that the resistors R1 and R2 are still of equal resistance value. Vdiff is calculated as follows:

$$Vdiff = e2 - e1 = (e2-b) - (e1-b) = Vbe2 - Vbe1 = dVbe$$

where e1 and e2 are the emitter voltages of Q1 and Q2, b is the base voltage, Vbe1 and Vbe2 are the base-emitter voltages of Q1 and Q2, and dVbe is the differential base-emitter voltage, which is the mismatch in Vbe between of Q1 and Q2. Therefore, Vdiff is a measure of Q1 and Q2's mismatch voltage at the current level which is set by R1 and R2. Disclosed RTA heat cycles improve the match in Vbe between Q1 and Q2, and also improve the resistance match between R1 and R2.

EXAMPLES

Disclosed aspects are further illustrated by the following specific Examples, which should not be construed as limiting the scope or content of this Disclosure in any way.

Figure 4:
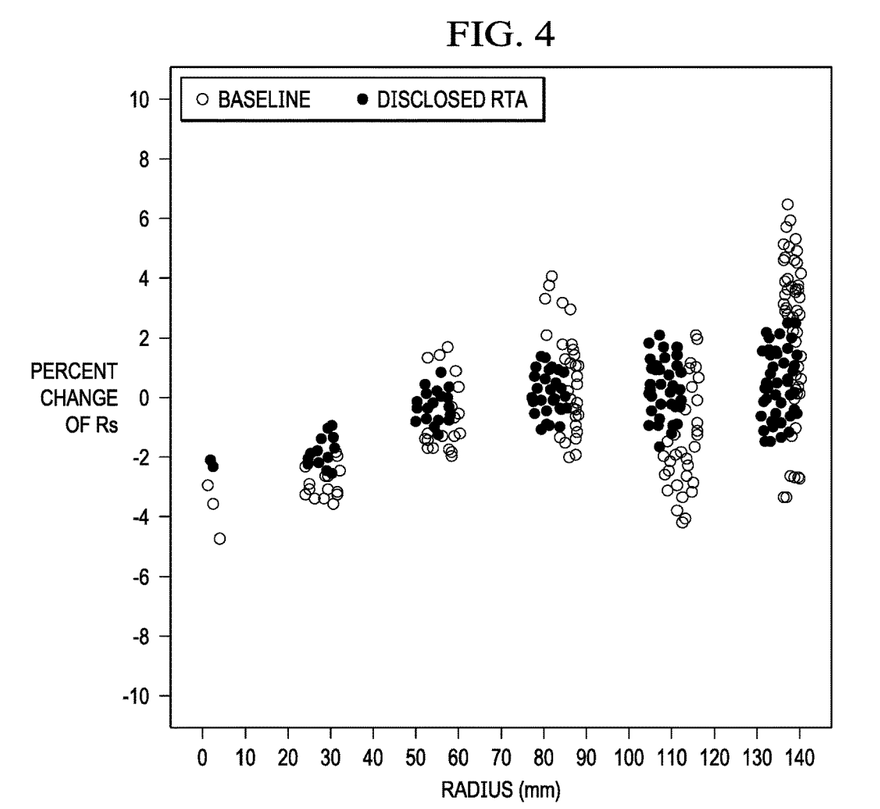
FIG. 4 shows data comparing Rs results obtained from the RTAs shown in FIG. 1 for boron doped polysilicon resistors that demonstrates a significant reduction in Rs variability in every zone across the wafer (the x-axis is the radial distance in mm from the wafer center).

FIG. 4 shows data comparing the Rs for boron doped ZTCRs obtained using for dopant activation the RTA 101 shown in FIG. 1 except the first time (stabilization time) at the lower temperature was 60 seconds, and for comparison also shown is Rs data from an RTA resembling RTA 100. The higher temperature used was 1,025° C. The wafers were 300 mm diameter silicon wafers, the polysilicon thickness was 1,250 Å, the polysilicon layer was over a layer of silicon oxide, and the ZCTRs received a boron ion implant dose of $4 \times 10^{15}$ cm$^{-2}$. Demonstrated in FIG. 4 is a significant reduction in Rs variability in every zone across the wafer (x-axis is the radial distance from the wafer center in mm) by using the 60 second stabilization time at the lower temperature before the ramping to the higher temperature. The largest Rs variability is seen to be at the outer edge of the wafer. The y-axis is the % change from a mean Rs value.

Figure 5:
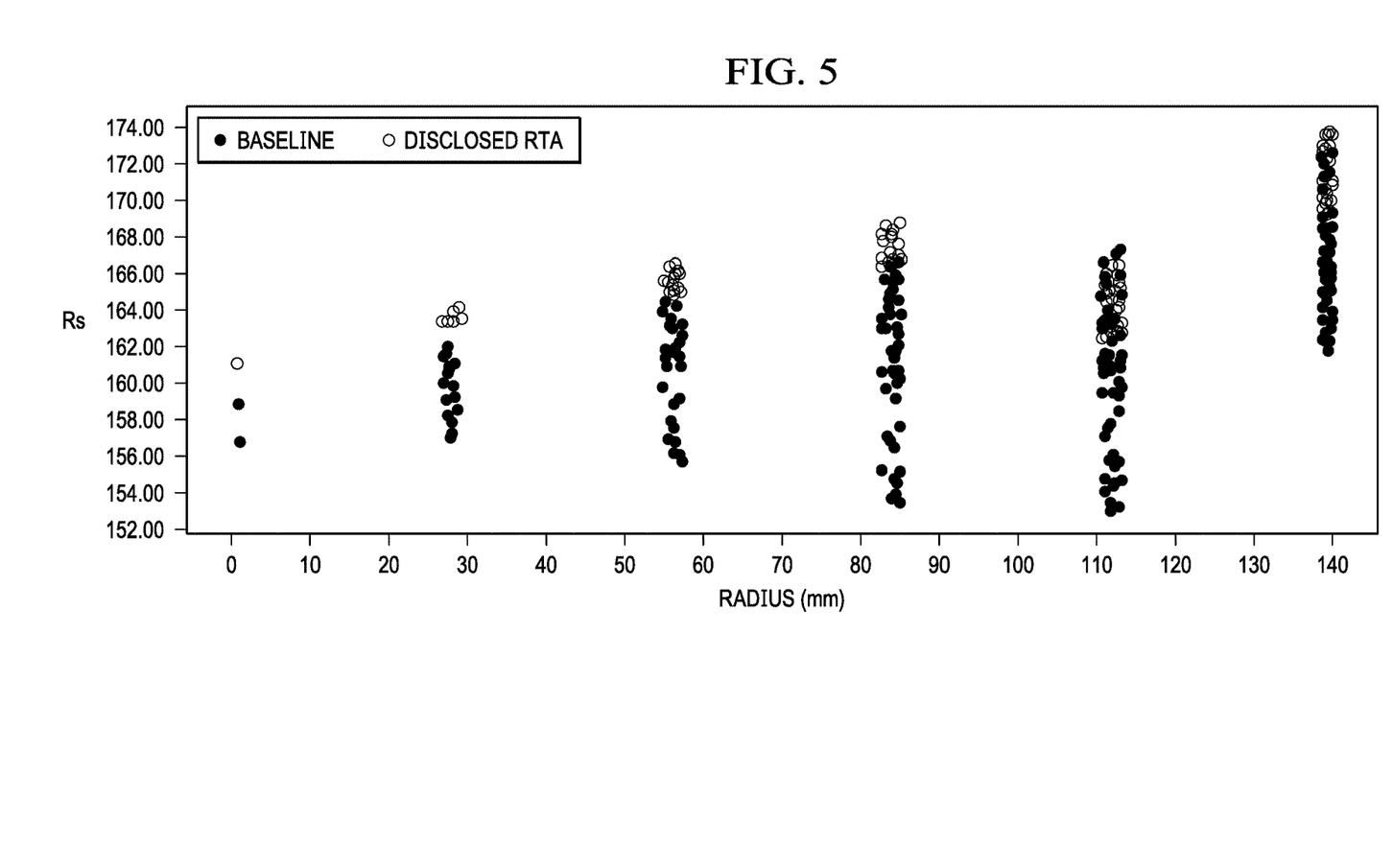
FIG. 5 shows the data in FIG. 4 now with the y-axis being Rs in ohms/sq. A significant reduction in Rs variability in every zone across the wafer is again demonstrated, with the x-axis again being the radial distance in mm.

FIG. 5 shows the data in FIG. 4, now with the y-axis being the Rs in ohms/sq. A significant reduction in Rs variability in every zone across the wafer is again demonstrated, with the x-axis again being the radial distance from the center of the wafer in mms.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. A method of fabricating an integrated circuit (IC), comprising:
    providing a substrate having a semiconductor surface layer thereon including a field dielectric in a portion of the semiconductor surface layer and a pair of matched devices in at least one of a complementary metal oxide semiconductor (CMOS) area, BiCMOS area, a bipolar transistor area, and a resistor area;
    ion implanting the substrate with at least one dopant into at least one of the CMOS area, the BiCMOS area, the bipolar transistor area, and the resistor area, and
    annealing the substrate in a processing chamber of a rapid thermal processor (RTP), wherein the annealing comprises an initial temperature stabilization step including first annealing at a lower temperature for a first time of at least 20 seconds, and then a second annealing comprising ramping from the lower temperature to a peak higher temperature that is at least 100° C. higher (>) than the lower temperature,
    wherein the IC comprises an analog IC including the CMOS area and the resistor area, the resistor area including polysilicon resistors at an intermediate stage of manufacturing.

2. The method of claim 1, wherein the polysilicon resistors are matched polysilicon resistors.

3. The method of claim 2, wherein the matched polysilicon resistors comprise zero temperature coefficient resistors (ZTCRs) at an intermediate stage of manufacturing.

4. The method of claim 1, wherein the lower temperature is 450° C. to 650° C., wherein the first time is 30 seconds to 90 seconds, and wherein the peak higher temperature is 850° C. to 1250° C.

5. The method of claim 1, wherein the annealing comprises soak rapid thermal annealing, standard rapid thermal annealing, or refined spike rapid thermal annealing.

6. The method of claim 5, wherein the annealing comprises the refined spike rapid thermal annealing, the peak higher temperature is at least 1000° C., and a time at the peak higher temperature is for less than 5 seconds.

7. The method of claim 1, wherein a time at the peak higher temperature is for less than 0.1 seconds.

8. The method of claim 1, wherein the annealing comprises laser annealing and the peak higher temperature is greater than 1000° C.

9. The method of claim 1, wherein the dopant comprises boron or indium.

10. The method of claim 1, wherein the dopant comprises phosphorus, arsenic or antimony.

11. The method of claim 1, wherein a dose for the dopant is at least $5 \times 10^{14}$ cm$^{-2}$.

12. The method of claim 1, wherein the matched devices comprise matched transistors.

13. The method of claim 1, wherein a minimum spacing between the pair of matched devices is <1 µm.

14. The method of claim 13, wherein the minimum spacing is less than 0.1 µm.

15. The method of claim 1, wherein a diameter of the substrate is at least 150 mm.

16. The method of claim 15, wherein the diameter of the substrate is at least 300 mm.

17. A method of fabricating an integrated circuit (IC), comprising:

providing a substrate having a semiconductor surface layer thereon including a field dielectric in a portion of the semiconductor surface layer and a pair of matched MOS transistors;

ion implanting the substrate with at least one dopant into the pair of matched MOS transistors, and annealing the substrate in a processing chamber of a rapid thermal processor (RTP), wherein the annealing comprises refined spike rapid thermal annealing including an initial temperature stabilization step at a lower temperature for a first time of at least 20 seconds, and then ramping from the lower temperature to a peak higher temperature that is at least 100° C. greater than the lower temperature for less than one second.

18. The method of claim 17, wherein the first time is 30 to 90 seconds.

19. The method of claim 17, wherein a diameter of the substrate is at least 200 mm.

20. A method of fabricating an integrated circuit (IC), comprising:

providing a semiconductor substrate;

ion implanting at least one dopant into a resistor area of the semiconductor substrate; and first annealing the semiconductor substrate by heating for a first time at a lower temperature in a range from 450° C. to 650° C. for at least 20 seconds in a processing chamber, immediately followed by heating in the processing chamber for a second time at a higher temperature that is at least 1000° C.

21. The method of claim 20, wherein the first time is in a range between 30 seconds and 90 seconds.

22. The method of claim 20, wherein the lower temperature is about 500° C.

23. The method of claim 20, wherein the higher temperature is at least 500° C. greater than the lower temperature.

24. The method of claim 20, wherein the first time is about 180 seconds and the second time is less than one second.

25. The method of claim 20, wherein heating to the higher temperature is performed by laser annealing.

26. The method of claim 20, wherein the at least one dopant includes boron.

27. The method of claim 20, wherein the resistor area includes two matched resistors at intermediate stage of manufacturing.

28. A method of fabricating an integrated circuit (IC), comprising:

providing a semiconductor substrate having a field dielectric thereover and polysilicon resistor body over the field dielectric;

implanting a dopant into the resistor body; and annealing the resistor body at a first temperature in a range between 450° C. and 650° C. for a time in a range of 30 seconds to 90 seconds, and then annealing the resistor body at a second temperature greater than 1000° C. for less than one second.

* * * * *